United States Patent
Zhang et al.

(10) Patent No.: US 9,949,398 B2
(45) Date of Patent: Apr. 17, 2018

(54) BACKPLANE AND COMMUNICATIONS DEVICE

(71) Applicant: HUAWEI TECHNOLOGIES CO., LTD., Shenzhen (CN)

(72) Inventors: Guodong Zhang, Shenzhen (CN); Jian Zhang, Shenzhen (CN); Jianping Shu, Shenzhen (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 15/363,429

(22) Filed: Nov. 29, 2016

(65) Prior Publication Data
US 2017/0079155 A1    Mar. 16, 2017

Related U.S. Application Data

(63) Continuation of application No. PCT/CN2015/079196, filed on May 18, 2015.

(30) Foreign Application Priority Data

Jun. 6, 2014    (CN) .......................... 2014 1 0251151

(51) Int. Cl.
*H01R 13/648*    (2006.01)
*H05K 7/14*    (2006.01)
(Continued)

(52) U.S. Cl.
CPC ....... *H05K 7/1439* (2013.01); *H01R 12/7005* (2013.01); *H01R 12/75* (2013.01);
(Continued)

(58) Field of Classification Search
CPC .... H01R 12/7005; H01R 12/79; H01R 27/02; H01R 29/00; H05K 7/1445; H05K 7/1439;
(Continued)

(56) References Cited

U.S. PATENT DOCUMENTS 3,705,378 A * 12/1972 Elkins ................... H01R 31/00
                                              439/638
3,963,300 A *  6/1976 Patton .................... H01R 31/02
                                              439/638
(Continued)

FOREIGN PATENT DOCUMENTS

CN        2852439 Y    12/2006
CN       101877932 A   11/2010
(Continued)

OTHER PUBLICATIONS

International Search Report (including English translation) issued in corresponding International Application No. PCT/CN2015/079196, dated Aug. 6, 2015, 7 pages.
(Continued)

*Primary Examiner* — Abdullah Riyami
*Assistant Examiner* — Vladimir Imas
(74) *Attorney, Agent, or Firm* — Huawei Technologies Co., Ltd.

(57) ABSTRACT

A backplane and a communications device are disclosed. The backplane includes: at least one fixing plate, multiple connectors, and multiple flexible cables, where signal connection is implemented between corresponding connectors by means of the flexible cables, each of the connectors is provided with a housing and multiple signal pins installed on the housing, and the housing is installed on the fixing plate and is provided with a jack for insertion of a connector of a subcard in the communications device; one end of each signal pin is inserted into the jack, and the other end is connected to each flexible cable. When the communications device provided with the backplane transmits a high-rate signal, transmission quality and a transmission rate are relatively high.

11 Claims, 7 Drawing Sheets

(51) Int. Cl.
*H01R 12/75* (2011.01)
*H05K 1/18* (2006.01)
*H01R 12/70* (2011.01)
*H01R 12/79* (2011.01)
*H05K 1/14* (2006.01)
*H04Q 1/02* (2006.01)

(52) U.S. Cl.
CPC ............... *H01R 12/79* (2013.01); *H04Q 1/15* (2013.01); *H05K 1/141* (2013.01); *H05K 1/18* (2013.01); *H05K 7/1449* (2013.01); *H05K 7/1451* (2013.01); *H05K 7/1452* (2013.01); *H05K 2201/044* (2013.01); *H05K 2201/10318* (2013.01); *H05K 2201/10356* (2013.01)

(58) Field of Classification Search
CPC .... H05K 1/141; H05K 1/18; H05K 2201/044; H05K 2201/10356; H05K 3/366
USPC ............................... 439/607.11, 505, 65, 941
See application file for complete search history.

(56) References Cited

U.S. PATENT DOCUMENTS

| | | | | |
|---|---|---|---|---|
| 4,236,779 A * | 12/1980 | Tang | ............... | H01R 13/6592 439/580 |
| 4,290,664 A * | 9/1981 | Davis | ............... | H01R 31/02 379/442 |
| 4,902,236 A * | 2/1990 | Hasircoglu | ............ | H05K 1/118 439/493 |
| 5,415,566 A * | 5/1995 | Brunker | ............... | H01R 23/688 439/607.11 |
| 6,171,139 B1 * | 1/2001 | Sato | ............... | H01R 12/724 439/502 |
| 6,322,395 B1 * | 11/2001 | Nishio | ............... | H01R 13/26 439/607.11 |
| 6,375,508 B1 * | 4/2002 | Pickles | ............... | H01R 12/727 439/607.11 |
| 6,663,429 B1 * | 12/2003 | Korsunsky | ............ | H01R 23/688 439/108 |
| 6,776,659 B1 * | 8/2004 | Stokoe | ............... | H01R 13/6587 439/607.11 |
| 6,799,981 B1 * | 10/2004 | Yu | ............... | H01R 13/6397 439/133 |
| 7,153,162 B2 * | 12/2006 | Mizumura | ........... | H01R 13/6586 439/607.11 |
| 8,366,485 B2 * | 2/2013 | Johnescu | ............ | H01R 13/514 439/108 |
| 8,398,429 B2 * | 3/2013 | Costello | ............... | H04Q 1/025 439/505 |
| 8,506,323 B2 * | 8/2013 | Costello | ............... | H04Q 1/025 439/505 |
| 8,745,438 B2 * | 6/2014 | Armstrong | ............ | H04L 41/0654 714/4.12 |
| 8,860,889 B2 * | 10/2014 | Choi | ............... | H01R 23/7073 348/730 |
| 8,944,831 B2 * | 2/2015 | Stoner | ............... | H01R 13/658 439/108 |
| 8,998,636 B2 * | 4/2015 | Gomez | ............... | H01R 27/02 439/505 |
| 9,236,684 B2 * | 1/2016 | Lin | ............... | H01R 13/6273 |
| 9,450,320 B2 * | 9/2016 | Jung | ............... | H01R 12/88 |
| 2009/0027867 A1 | 1/2009 | Yamamoto | | |
| 2010/0029126 A1 | 2/2010 | Ngo | | |
| 2012/0002358 A1 | 1/2012 | Hayashi | | |
| 2012/0071034 A1 | 3/2012 | Li | | |
| 2015/0049451 A1 | 2/2015 | Wang et al. | | |

FOREIGN PATENT DOCUMENTS

| | | |
|---|---|---|
| CN | 102265721 A | 11/2011 |
| CN | 102307142 A | 1/2012 |
| CN | 102681618 A | 9/2012 |
| CN | 102725924 A | 10/2012 |
| CN | 202474911 U | 10/2012 |
| CN | 103503590 A | 1/2014 |
| CN | 103718658 A | 4/2014 |
| CN | 104064893 A | 9/2014 |
| EP | 2453727 A2 | 5/2012 |
| JP | H0886835 A | 4/1996 |
| WO | 2013163867 A1 | 11/2013 |

OTHER PUBLICATIONS

Office Action (including English translation) issued in corresponding Chinese Patent Application No. 201410251151.4, dated Sep. 25, 2015, 16 pages.

Extended European Search Report (including English translation) issued in corresponding International Application No. PCT/CN2015/079196, dated Nov. 7, 2017, 7 pages.

* cited by examiner

BACKPLANE AND COMMUNICATIONS DEVICE

CROSS-REFERENCE TO RELATED APPLICATIONS

This application is a continuation of International Application No. PCT/CN2015/079196, filed on May 18, 2015, which claims priority to Chinese Patent Application No. 201410251151.4, filed on Jun. 6, 2014, the contents of both applications are hereby incorporated by reference in their entireties.

TECHNICAL FIELD

The present disclosure relates to the field of communications system technologies, and in particular, to a backplane and a communications device.

BACKGROUND

In a communications system, a backplane is an important composition part of a communications device, generally includes multiple layers of printed circuit boards PCB boards and connectors, and provides functions of electrical signal connection and physical support for each subcard and module in the communications system.

SUMMARY

The present disclosure provides a backplane and a communications device.

According to a first aspect, a backplane of a communications device is provided. The backplane may include: at least one fixing plate, multiple connectors, and multiple flexible cables, where signal connection is implemented between corresponding connectors by means of the flexible cables, each of the connectors is provided with a housing and multiple signal pins installed on the housing, the housing is installed on the fixing plate, and the housing is provided with a jack for insertion of a connector of a subcard in the communications device; one end of each signal pin is inserted into the jack, and the other end is connected to one of the multiple flexible cables; and a surface of each fixing plate facing the subcard in the communications device is an insertion surface of the fixing plate, and the multiple flexible cables are located on a side of the fixing plate opposite to the insertion surface.

It is to be understood that the foregoing general description and the following detailed description are exemplary and explanatory only and are not restrictive of the present disclosure, as claimed.

BRIEF DESCRIPTION OF DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

Figure 1:
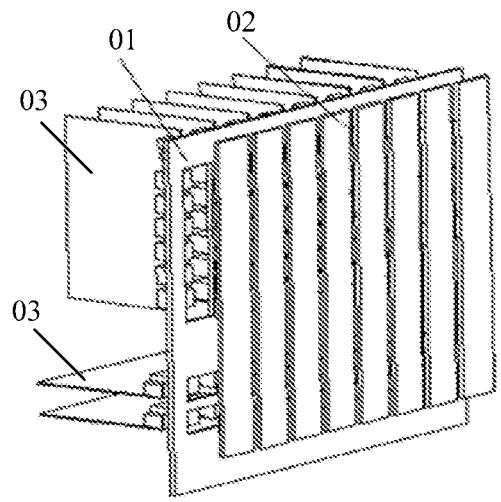
FIG. 1 is a schematic structural diagram of a back surface of a backplane.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above, except where different specific meanings have otherwise been set forth herein.

DETAILED DESCRIPTION

The following clearly describes the technical solutions in the embodiments of the present disclosure with reference to the accompanying drawings in the embodiments of the present disclosure. Apparently, the described embodiments are merely some but not all of the embodiments of the present disclosure. All other embodiments obtained by a person of ordinary skill in the art based on the embodiments of the present disclosure without creative efforts shall fall within the protection scope of the present disclosure.

The terminology used in the present disclosure is for the purpose of describing exemplary examples only and is not intended to limit the present disclosure. As used in the present disclosure and the appended claims, the singular forms "a," "an" and "the" are intended to include the plural forms as well, unless the context clearly indicates otherwise. It shall also be understood that the terms "or" and "and/or" used herein are intended to signify and include any or all possible combinations of one or more of the associated listed items, unless the context clearly indicates otherwise.

It shall be understood that, although the terms "first," "second," "third," etc. may include used herein to describe various information, the information should not be limited by these terms. These terms are only used to distinguish one category of information from another. For example, without departing from the scope of the present disclosure, first information may include termed as second information; and similarly, second information may also be termed as first information. As used herein, the term "if" may include understood to mean "when" or "upon" or "in response to" depending on the context.

Reference throughout this specification to "one embodiment," "an embodiment," "exemplary embodiment," or the like in the singular or plural means that one or more particular features, structures, or characteristics described in connection with an example is included in at least one embodiment of the present disclosure. Thus, the appearances of the phrases "in one embodiment" or "in an embodiment," "in an exemplary embodiment," or the like in the singular or plural in various places throughout this specification are not necessarily all referring to the same embodiment. Furthermore, the particular features, structures, or characteristics in one or more embodiments may include combined in any suitable manner.

With continuous development of a communications system technology, a large capacity requirement of the communications system requires a higher signal transmission rate in the backplane and a greater channel for signal transmission, and further, requirements for a quantity of layers, size, and density of conductive patterns in the PCB board of the backplane are higher. Moreover, the high transmission rate has higher requirements for an insulation material of the PCB board and precision of the conductive pattern in the PCB board. However, in a conventional PCB manufacturing technology, addition of the quantity of layers of the conductive patterns in the PCB board directly leads to an exponential growth of manufacturing difficulty and manufacturing costs of the PCB board, and even leads to a case in which processing cannot be performed. In addition, because the conductive pattern in the PCB board is processed by means of etching, the size and the precision of the conductive pattern cannot satisfy a requirement of high-rate signal transmission in an internal system.

Figure 2:
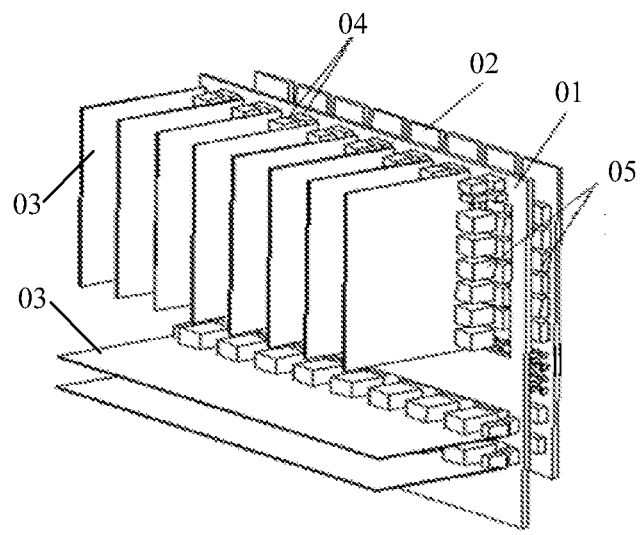
FIG. 2 is a schematic structural diagram of a front surface of the backplane with the structure shown in FIG. 1.

Therefore, a backplane is provided. Referring to FIG. 1 and FIG. 2, in the backplane, a PCB board is divided into a large backplane 01 and a group of small backplanes 02, and the large backplane 01 and the small backplanes 02 are assembled in a laminated manner. The large backplane 01 is used for transmission of a power source, transmission of a power source and a low-rate signal, and the small backplanes 02 are used for transmission of a high-rate signal, transmission of a high-rate signal and a low-rate signal, light transmission. The small backplanes 02 may be independent of the large backplane 01 and are assembled and disassembled in a manner of a chassis. Further, referring to FIG. 2, signal connection is implemented between subcards 03 and the large backplane 01 by means of insertion of connectors 04, and signal connection is implemented between the small backplanes 02 and the large backplane 01 by means of insertion of connectors 05.

Although the backplane with the foregoing structure separates wiring of the high-rate signal and configures the wiring in the backplanes 02, the signal transmission rate in the small backplanes 02 is still limited by a conventional PCB board manufacturing process, further leading to poor transmission quality and a low transmission rate of the high-rate signal in the communications device and an inflexible arrangement manner of a signal channel in the communications device.

Embodiments of the present disclosure provide a backplane, and a communications device provided with the backplane. The backplane can improve transmission quality and a transmission rate of a high-rate signal in a communications device, and an arrangement manner of a signal channel is flexible.

Figure 3:
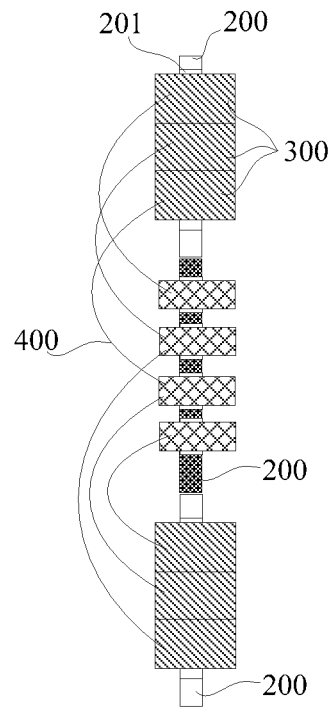
FIG. 3 is a schematic structural diagram of a backplane according to an embodiment of the present disclosure.
Figure 4:
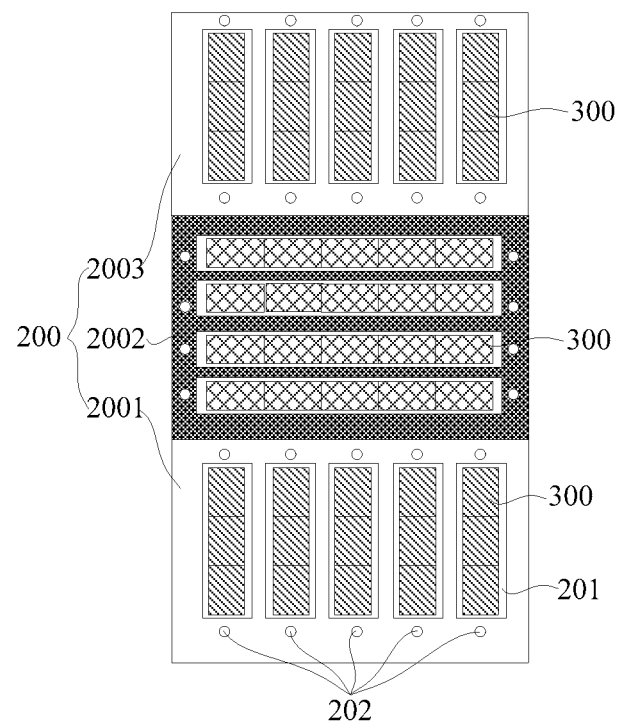
FIG. 4 is a front view of the backplane with the structure shown in FIG. 3.

Referring to FIG. 3 and FIG. 4, FIG. 3 is a schematic structural diagram of a backplane according to an embodiment of the present disclosure, and FIG. 4 is front view of the backplane with the structure shown in FIG. 3. The backplane of the communications device provided in this embodiment includes a backplane. The backplane is provided with at least one fixing plate 200, a fixing plate 2001, a fixing plate 2002, and a fixing plate 2003 shown in FIG. 4, and further includes multiple connectors 300 and multiple flexible cables 400. Signal connection is implemented between corresponding connectors 300 by means of the multiple flexible cables 400. As shown in FIG. 4, multiple connectors 300 are separately installed on the fixing plate 2001, the fixing plate 2002, and the fixing plate 2003.

Figure 5:
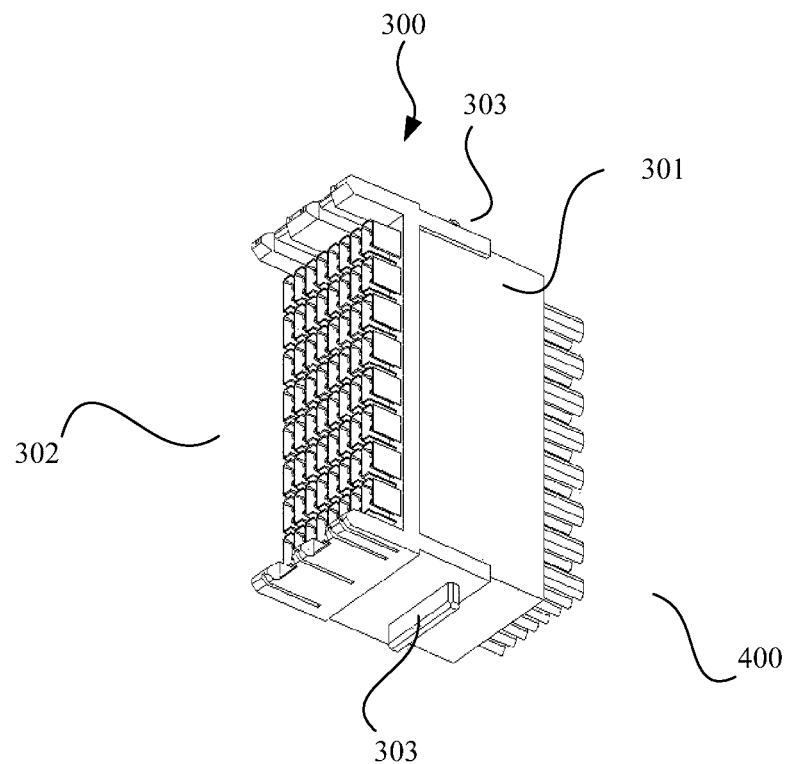
FIG. 5 is a schematic structural diagram of connectors in a backplane according to an embodiment of the present disclosure.

Referring to FIG. 3 and FIG. 5 together, FIG. 5 is a schematic structural diagram of connectors in a backplane according to an embodiment of the present disclosure. Each connector 300 of the multiple connectors 300 is provided with a housing 301 and multiple signal pins 302 installed on the housing 301. The housing 301 is installed on the fixing plate 200, and the housing 301 is provided with a jack for insertion of a connector of a subcard in the communications device. One end of each signal pin 302 is inserted into the jack, and the other end is connected to one flexible cable 400 of the multiple flexible cables 400. A surface of each fixing plate 200 facing the subcard in the communications device is an insertion surface of the fixing plate, and the multiple flexible cables 400 are located on a side of the fixing plate 200 opposite to the insertion surface.

Generally, for the convenience of description, the side of each fixing plate 200 opposite to the insertion surface is referred to as a back side of the fixing plate 200.

In the backplane, before the multiple connectors 300 are installed on the fixing plate 200, signal connection may be implemented, by means of the flexible cables 400, between the multiple connectors 300 needing to be connected, and then the corresponding multiple connectors 300 only need to be installed on corresponding positions of the at least one fixing plate 200, so that the assembling is convenient. At the same time, signal connection is implemented, by means of the flexible cables 400, between multiple connectors 300 needing to be connected in the backplane, and the multiple flexible cables 400 are located on a side of each fixing plate 200 opposite to the insertion surface of the fixing plate, which does not cause an impact on the connection between the subcard and the backplane. A high-rate signal in the backplane may be transmitted by means of the flexible cables 400. Further, when the communications device provided with the backplane transmits a high-rate signal, transmission quality and a transmission rate of the high-rate signal are not limited by a conventional PCB board manufacturing process, and the high-rate signal of the communications device has relatively high transmission quality and a relatively high transmission rate. Moreover, installation positions of the connectors 300 may be selected according to actual requirements, and an arrangement manner of a signal channel in the backplane is flexible.

Figure 6A:
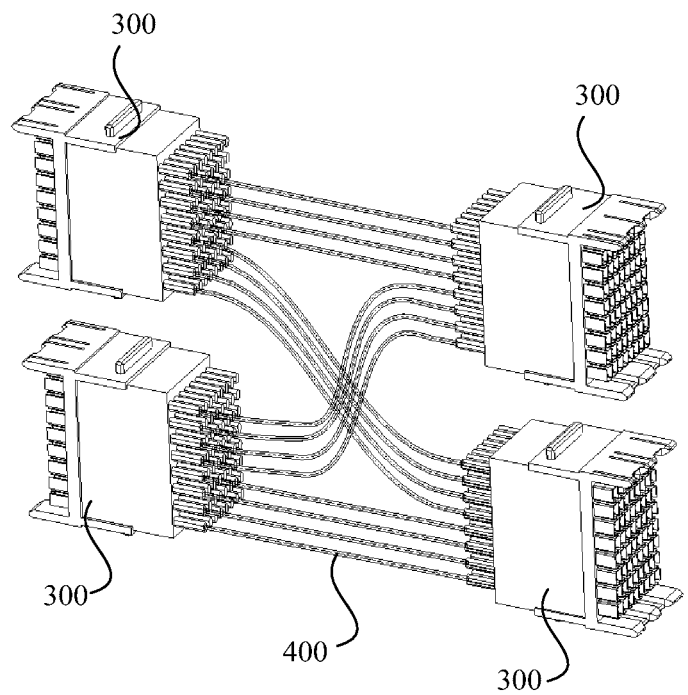
FIG. 6a and FIG. 6b are a schematic diagram of a connection manner of connectors according to an embodiment of the present disclosure.
Figure 6B:
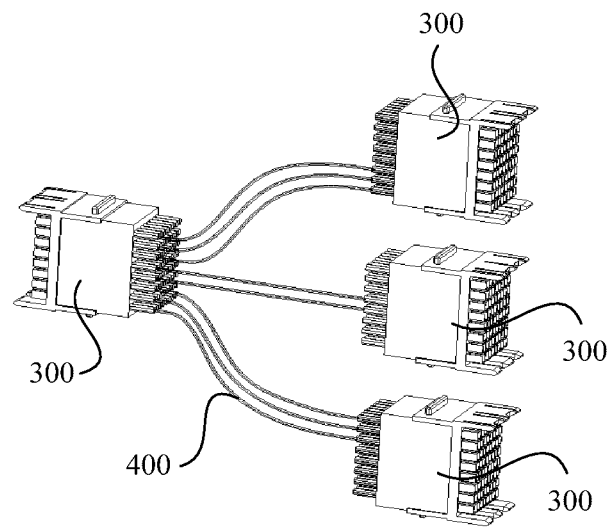

In addition, referring to FIG. 6a and FIG. 6b, FIG. 6a and FIG. 6b are a schematic diagram of a connection manner of connectors according to an embodiment of the present disclosure. In the backplane, the connection manner of the connectors 300 is relatively flexible. For example, multiple connectors 300 may be connected to multiple connectors 300, as shown in FIG. 6a; or, one connector 300 may be connected to multiple connectors 300 at the same time, as shown in FIG. 6b. The connection manner is not limited by a shape of a small backplane in the conventional backplane and a distribution manner.

Referring to FIG. 3 and FIG. 4, in an embodiment, the fixing plate 200 of each backplane is provided with at least one connector opening 201 running through a thickness direction of the fixing plate, a housing 301 of each connector 300 runs through the fixing plate 200 through the connector opening 201, and the flexible cable 400 is inserted into the housing 301 from the side of the housing 301 opposite to a jack of the housing 301.

Specifically, in the foregoing embodiment, the connector 300 and the fixing plate 200 are assembled by means of at least one pair of a limiting groove and a limiting bulge that are in clearance fit, so that a position of the connector 300 relative to the fixing plate 200 is adjustable in a length direction of the connector opening 201 and a width direction of the connector opening 201.

Certainly, a position of the connector 300 relative to the fixing plate 200 is also adjustable perpendicularly to a length direction of the connector opening 201 and perpendicularly to a width direction of the connector opening 201.

Figure 9:
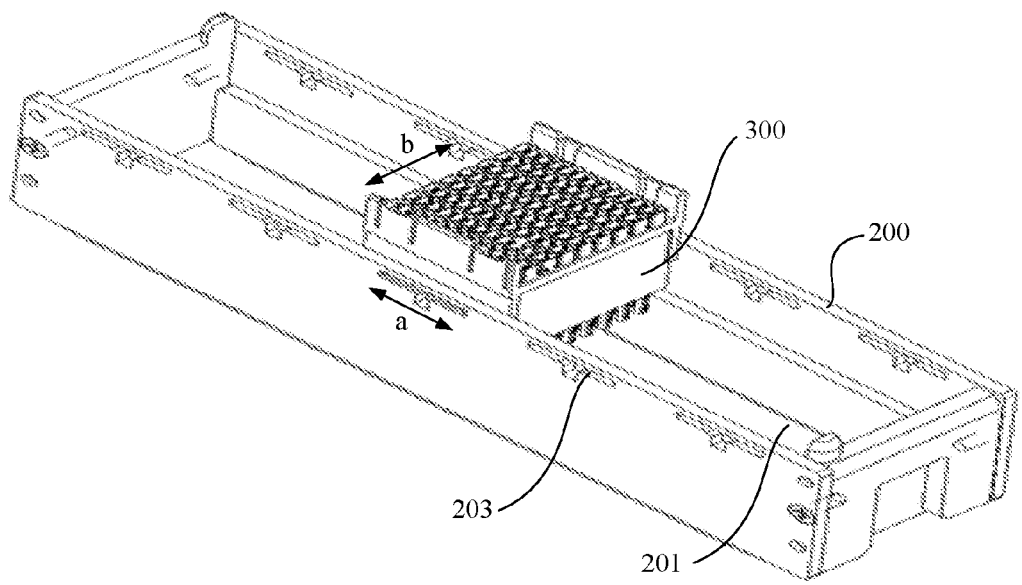
FIG. 9 is a schematic structural diagram of assembling connectors and a fixing plate according to an embodiment of the present disclosure.

As shown in FIG. 9, each connector 300 and the fixing plate 200 are connected by means of two pairs of limiting grooves and limiting bulges that are in clearance fit, where the two limiting grooves are separately formed on the fixing plate 200, for example, limiting grooves 203 shown in FIG. 9, and are located on two opposite side walls of the connector opening 201; and the two limiting bulges are disposed on the housing 301 of the connector 300, for example, limiting bulges 303 shown in FIG. 5, and are located on two opposite side surfaces of the housing 301; or the two limiting bulges are separately formed on the fixing plate 200, and are located on two opposite side walls of the connector opening 201; and the two limiting grooves are disposed on the housing 301 of the connector 300, and are located on two opposite side surfaces of the housing 301 (not shown in the figure).

After the connector 300 is installed on the fixing plate 200, and a position of the connector 300 relative to the fixing plate 200 may be adjusted in a direction a shown in FIG. 9, and the position of the connector 300 relative to the fixing plate 200 may be adjusted in a direction b shown in FIG. 9, so that each connector 300 has particular relocatability relative to the fixing plate 200, thereby lowering a requirement on a position precision of the connector disposed on the subcard in the communications device, and facilitating assembling between the subcard and the backplane in the communications device.

In an embodiment, in the backplane provided in this embodiment, signal connection may be implemented between each flexible cable 400 and a signal pin 302 by means of welding, crimping, clamping, or wrapping.

Figure 7:
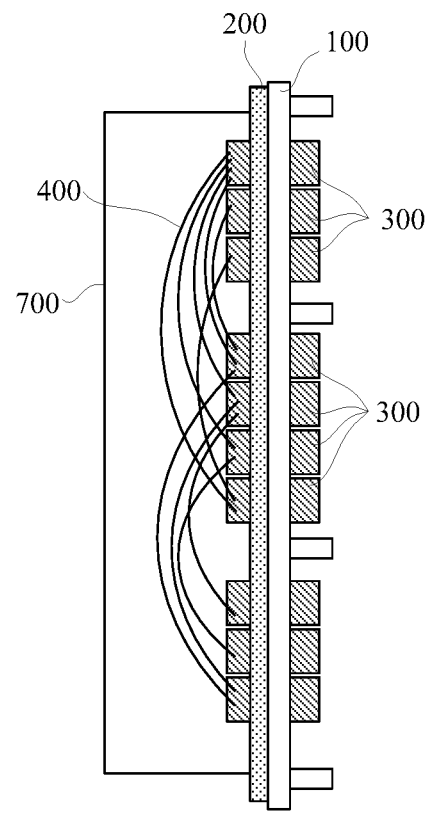
FIG. 7 is a schematic structural diagram of a backplane according to another embodiment of the present disclosure.
Figure 8:
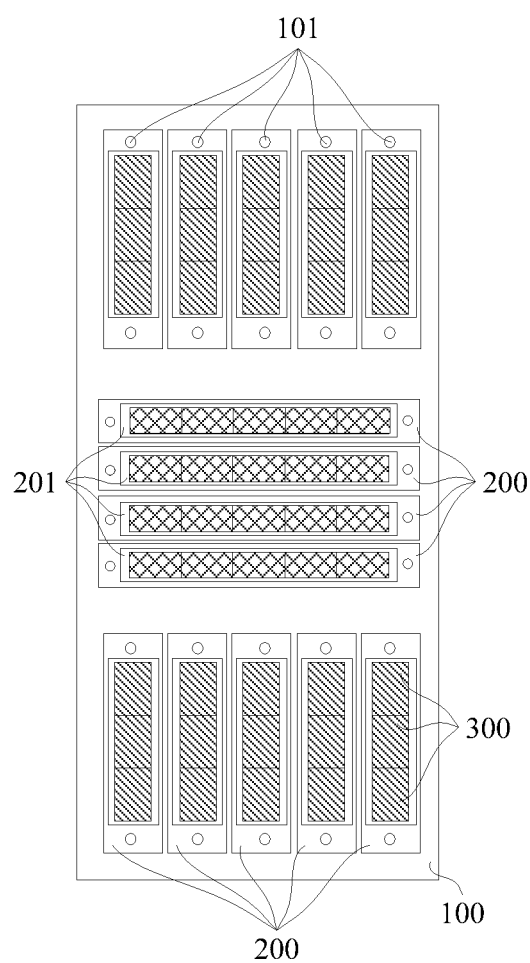
FIG. 8 is a schematic structural diagram showing that connectors in the backplane with the structure shown in FIG. 7 are installed on a fixing plate.

Referring to FIG. 7 and FIG. 8, FIG. 7 is a schematic structural diagram of a backplane according to another embodiment of the present disclosure, and FIG. 8 is a schematic structural diagram showing that a connector in the backplane with the structure shown in FIG. 7 is installed on a fixing plate. The backplane of the backplane provided in an embodiment further includes a printed circuit board 100, and a fixing plate 200 is installed on the printed circuit board 100, where the printed circuit board 100 is provided with wiring; and/or the printed circuit board 100 is provided with a power source channel; and/or the printed circuit board 100 is provided with a power source connector; and/or the printed circuit board 100 is provided with a signal connector.

With reference to FIG. 4 and FIG. 8, in order to facilitate alignment between the fixing plate 200 and the printed circuit board 100, in an embodiment, as shown in FIG. 8, the printed circuit board 100 is provided with multiple guide pins 101. Moreover, as shown in FIG. 4, each fixing plate 200 is provided with at least two pin holes 202 that are in guide fit with the guide pins 101, so that each fixing plate 200 and the printed circuit board 100 are aligned by means of guiding between a corresponding pin hole 202 and a corresponding guide pin 101. When the fixing plate 200 and the printed circuit board 100 are assembled, the pin hole 202 on the fixing plate 200 is aligned with the guide pin 101 on the printed circuit board 100, then the guide pin 101 is enabled to penetrate into the corresponding pin hole 202, so that guiding between the fixing plate 200 and the printed circuit board 100 is implemented by means of fit between the guide pin 101 and the pin hole 202, thereby facilitating alignment between the fixing plate 200 and the printed circuit board 100.

In an embodiment, the flexible cables 400 in the backplane are metal conducting wires or optical fibers.

In addition, the form and the structure of the backplane provided in the present disclosure may have multiple combination manners.

Figure 10:
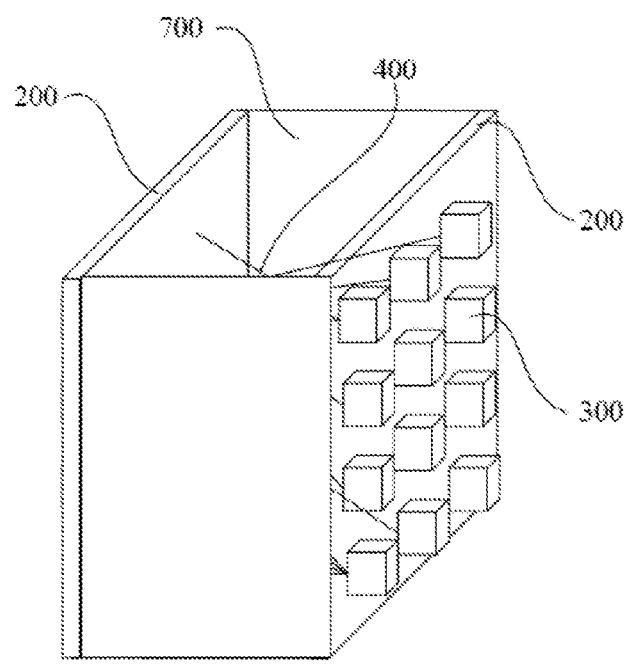
FIG. 10 is an arrangement manner of a fixing plate of a backplane according to an embodiment of the present disclosure.
Figure 11:
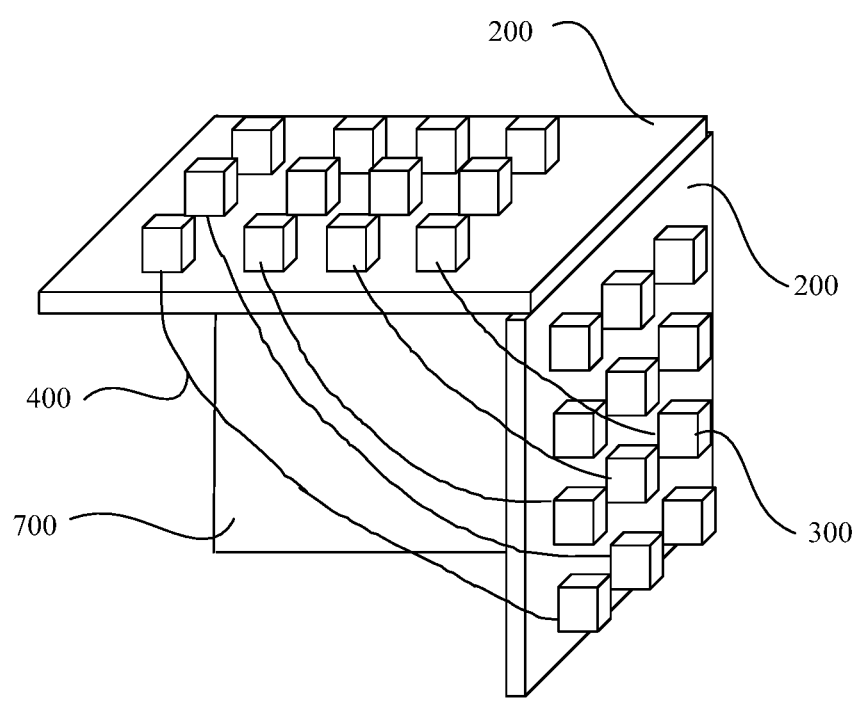
FIG. 11 is another arrangement manner of a fixing plate of a backplane according to an embodiment of the present disclosure.

For example, referring to FIG. 10, the backplane includes two fixing plates 200, where the two fixing plates 200 are parallel to each other, and insertion surfaces are disposed opposite to each other, and flexible cables 400 are located between the two fixing plates 200; or referring to FIG. 11, the two fixing plates 200 of the backplane are perpendicular to each other, where in the two fixing plates 200, one side of a fixing plate is spliced with one side of the other fixing plate, and the multiple flexible cables 400 are located in a region of an angle of 90 degrees formed between the two fixing plates 200.

Certainly, the backplane may also have another combination manner, and details are not described herein.

Refer to FIG. 7, FIG. 10, and FIG. 11. As shown in FIG. 7, FIG. 10, and FIG. 11, in a backplane provided in an embodiment, the backplane further includes at least one baffle 700, the baffle is located on sides of the two fixing plates 200 opposite to the insertion surfaces of the two fixing plates 200, a protective cover that is located on the sides of the two fixing plates 200 opposite to the insertion surfaces of the two fixing plates 200 is formed between the at least one baffle 700 and the two fixing plates 200, and the flexible cables 400 are located in the protective cover. The protective cover can protect the flexible cables 400.

According to a second aspect, an embodiment of the present disclosure further provides a communications device, including multiple subcards and any backplane provided in the foregoing embodiments. A connector of each subcard is inserted into a jack of a connector 300 of the backplane, so as to implement signal connection between the connector of the subcard and the connector of the backplane.

When the communications device transmits a high-rate signal, transmission quality and a transmission rate of the high-rate signal are not limited by a conventional PCB board manufacturing process, and the high-rate signal of the communications device has relatively high transmission quality and a relatively high transmission rate.

The present disclosure provides a backplane and a communications device. The backplane can improve transmission quality and a transmission rate of a high-rate signal in a communications device, and an arrangement manner of a signal channel is flexible.

According to a first aspect, a backplane of a communications device is provided, where the backplane includes: at least one fixing plate, multiple connectors, and multiple flexible cables, where signal connection is implemented between corresponding connectors by means of the flexible cables, each of the connectors is provided with a housing and multiple signal pins installed on the housing, the housing is installed on the fixing plate, and the housing is provided with a jack for insertion of a connector of a subcard in the communications device; one end of each signal pin is inserted into the jack, and the other end is connected to one of the multiple flexible cables; and a surface of each fixing plate facing the subcard in the communications device is an insertion surface of the fixing plate, and the multiple flexible cables are located on a side of the fixing plate opposite to the insertion surface.

With reference to the first aspect, in a first possible implementation manner, each fixing plate is provided with at least one connector opening running through a thickness direction of the fixing plate, and a housing of each connector runs through the fixing plate through the connector opening.

With reference to the first possible implementation manner of the first aspect, in a second possible implementation manner, the connector and the fixing plate are assembled by means of at least one pair of a limiting groove and a limiting bulge that are in clearance fit, so that a position of the connector relative to the fixing plate is adjustable in a length direction of the connector opening and a width direction of the connector opening.

With reference to the second possible implementation manner of the first aspect, in a third possible implementation manner, the connector and the fixing plate are connected by means of two pairs of limiting grooves and limiting bulges that are in clearance fit, where the two limiting grooves are separately formed on the fixing plate, and are located on two opposite side walls of the connector opening; and the two limiting bulges are disposed on the housing of the connector, and are located on two opposite side surfaces of the housing; or the two limiting bulges are separately formed on the fixing plate, and are located on two opposite side walls of the connector opening; and the two limiting grooves are disposed on the housing of the connector, and are located on two opposite side surfaces of the housing.

With reference to the first aspect, the first possible implementation manner of the first aspect, the second possible implementation manner of the first aspect, and the third possible implementation manner of the first aspect, in a fourth possible implementation manner, the backplane further includes a printed circuit board, and the fixing plate is installed on the printed circuit board.

With reference to the fourth possible implementation manner of the first aspect, in a fifth possible implementation manner, the printed circuit board is provided with multiple guide pins, and each fixing plate is provided with at least two pin holes that are in guide fit with the guide pins, so that each fixing plate and the printed circuit board are aligned by means of guiding between a corresponding pin hole and a corresponding guide pin.

With reference to the first aspect, the first possible implementation manner of the first aspect, the second possible implementation manner of the first aspect, the third possible implementation manner of the first aspect, the fourth possible implementation manner of the first aspect, and the fifth possible implementation manner of the first aspect, in a sixth possible implementation manner, the flexible cables are metal conducting wires or optical fibers.

With reference to the first aspect, the first possible implementation manner of the first aspect, the second possible implementation manner of the first aspect, the third possible implementation manner of the first aspect, the fourth possible implementation manner of the first aspect, the fifth possible implementation manner of the first aspect, and the sixth possible implementation manner of the first aspect, in a seventh possible implementation manner, the backplane includes two fixing plates, where the two fixing plates are parallel to each other, and the multiple flexible cables are located between the two fixing plates; or the two fixing plates are perpendicular to each other, one side of one of the two fixing plates is spliced with one side of the other fixing plate, and the flexible cables are located in a region of an angle of 90 degrees formed between the two fixing plates.

With reference to the seventh possible implementation manner of the first aspect, in an eighth possible implementation manner, the backplane further includes at least one baffle, the baffle is located on sides of the two fixing plates opposite to the insertion surfaces of the two fixing plates, a protective cover that is located on the sides of the two fixing plates opposite to the insertion surfaces of the two fixing plates is formed between the at least one baffle and the two fixing plates, and the flexible cables are located in the protective cover.

According to a second aspect, a communications device is provided, where the communications device includes multiple subcards and any backplane provided in the first aspect, the first possible implementation manner of the first aspect, the second possible implementation manner of the first aspect, the third possible implementation manner of the first aspect, the fourth possible implementation manner of the first aspect, the fifth possible implementation manner of the first aspect, the sixth possible implementation manner of the first aspect, the seventh possible implementation manner of the first aspect, or the eighth possible implementation manner of the first aspect, where a connector of each subcard is inserted into a jack of a connector of the backplane, to implement signal connection between the connector of the subcard and the connector of the backplane.

With reference to the backplane provided in the first aspect and the communications device provided in the second aspect, the backplane includes at least one fixing plate, multiple connectors, and multiple flexible cables, and signal connection is implemented, by means of the flexible cables, between the connectors needing to be connected. During a specific operation process, before the multiple connectors are installed on the fixing plate, signal connection may be implemented between the multiple connectors by means of the flexible cables, and then corresponding connectors only need to be installed on corresponding positions on the at least one fixing plate, so that the assembling is convenient. At the same time, in the backplane, a surface of the fixing plate facing a subcard in the communications device is an insertion surface of the fixing plate, signal connection is implemented, by means of the flexible cables, between multiple connectors disposed on the backplane, and the multiple flexible cables are located on a side of each fixing plate opposite to the insertion surface of the fixing plate. A high-rate signal in the backplane may be transmitted by means of the flexible cables. Further, when the communications device provided with the backplane transmits a high-rate signal, transmission quality and a transmission rate of the high-rate signal are not limited by a conventional PCB board manufacturing process, and the high-rate signal of the communications device has relatively high transmission quality and a relatively high transmission rate.

A person skilled in the art can make various modifications and variations to the embodiments of the present disclosure without departing from the spirit and scope of the present disclosure. The present disclosure is intended to cover these modifications and variations provided that they fall within the scope of protection defined by the following claims and their equivalent technologies.

What is claimed is:

1. A backplane of a communications device, comprising:
at least one fixing plate, multiple connectors, and multiple flexible cables, wherein signal connection is implemented between corresponding connectors by means of the flexible cables, each of the connectors is provided with a housing and multiple signal pins installed on the housing, the housing is installed on the fixing plate, and the housing is provided with a jack for insertion of a connector of a subcard in the communications device; one end of each signal pin is inserted into the jack, and the other end is connected to one of the multiple flexible cables; and a surface of each fixing plate facing the subcard in the communications device is an insertion surface of the fixing plate, and the multiple flexible cables are located on a side of the fixing plate opposite to the insertion surface; and
a printed circuit board provided with multiple guide pins, wherein one of the at least one fixing plate is provided with at least two pin holes that are in guide fit with the guide pins.

2. The backplane according to claim 1, wherein each fixing plate is provided with at least one connector opening running through a thickness direction of the fixing plate, and a housing of each connector runs through the fixing plate through the connector opening.

3. The backplane according to claim 2, wherein the connector and the fixing plate are assembled by means of at least one pair of a limiting groove and a limiting bulge that are in clearance fit, so that a position of the connector relative to the fixing plate is adjustable in a length direction of the connector opening and a width direction of the connector opening.

4. The backplane according to claim 3, wherein the connector and the fixing plate are connected by means of two pairs of limiting grooves and limiting bulges that are in clearance fit, wherein
the two limiting grooves are separately disposed on the fixing plate, and are located on two opposite side walls of the connector opening; and the two limiting bulges are disposed on the housing of the connector, and are located on two opposite side surfaces of the housing.

5. The backplane according to claim 1, wherein the fixing plate is installed on the printed circuit board.

6. The backplane according to claim 5, wherein each fixing plate and the printed circuit board are aligned by means of guiding between a corresponding pin hole and a corresponding guide pin.

7. The backplane according to claim 1, wherein the flexible cables are metal conducting wires or optical fibers.

8. The backplane according to claim 1, wherein the backplane comprises two fixing plates, wherein the two fixing plates are parallel to each other, and the multiple flexible cables are located between the two fixing plates; or the two fixing plates are perpendicular to each other, one side of one of the two fixing plates is spliced with one side of the other fixing plate, and the flexible cables are located in a region of an angle of 90 degrees formed between the two fixing plates.

9. The backplane according to claim 8, wherein the backplane further comprises at least one baffle, the baffle is located on sides of the two fixing plates opposite to insertion surfaces of the two fixing plates, a protective cover that is located on the sides of the two fixing plates opposite to the insertion surfaces of the two fixing plates is formed between the at least one baffle and the two fixing plates, and the flexible cables are located in the protective cover.

10. The backplane according to claim 1, wherein the backplane is included in a communications device comprising multiple subcards, wherein a connector of each subcard is inserted into a jack of a connector of the backplane, to implement signal connection between the connector of the subcard and the connector of the backplane.

11. The backplane according to claim 3, wherein the connector and the fixing plate are connected by means of two pairs of limiting grooves and limiting bulges that are in clearance fit, wherein the two limiting bulges are separately disposed on the fixing plate, and are located on two opposite side walls of the connector opening; and the two limiting grooves are disposed on the housing of the connector, and are located on two opposite side surfaces of the housing.

* * * * *